United States Patent
Shu et al.

(10) Patent No.: US 7,245,124 B2
(45) Date of Patent: Jul. 17, 2007

(54) UNDER-SAMPLED 3D MRI USING A SHELLS K-SPACE SAMPLING TRAJECTORY

(75) Inventors: Yunhong Shu, Rochester, MN (US); Matthew A. Bernstein, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 11/341,242

(22) Filed: Jan. 27, 2006

(65) Prior Publication Data

US 2006/0226836 A1 Oct. 12, 2006

Related U.S. Application Data

(60) Provisional application No. 60/670,588, filed on Apr. 12, 2005.

(51) Int. Cl.
*G01V 3/00* (2006.01)

(52) U.S. Cl. .......................... 324/307; 324/309
(58) Field of Classification Search .................. None
See application file for complete search history.

(56) References Cited

U.S. PATENT DOCUMENTS

| | | | | |
|---|---|---|---|---|
| 5,532,595 A | * | 7/1996 | Lampman et al. | 324/309 |
| 5,604,434 A | * | 2/1997 | Schomberg | 324/309 |
| 5,652,516 A | * | 7/1997 | Adalsteinsson et al. | 324/309 |
| 6,281,681 B1 | * | 8/2001 | Cline et al. | 324/310 |
| 6,411,089 B1 | * | 6/2002 | Anand et al. | 324/309 |
| 6,771,068 B2 | * | 8/2004 | Dale et al. | 324/307 |
| 6,958,605 B2 | * | 10/2005 | Dale et al. | 324/307 |
| 6,995,560 B2 | * | 2/2006 | Duerk et al. | 324/310 |
| 7,042,215 B2 | * | 5/2006 | Moriguchi et al. | 324/307 |
| 7,078,899 B2 | * | 7/2006 | Dale et al. | 324/314 |
| 7,109,707 B2 | * | 9/2006 | Griffin | 324/307 |
| 7,127,092 B2 | * | 10/2006 | Jack et al. | 382/128 |
| 2002/0180436 A1 | * | 12/2002 | Dale et al. | 324/307 |
| 2003/0153826 A1 | * | 8/2003 | Jack et al. | 600/410 |
| 2004/0210385 A1 | * | 10/2004 | Dale et al. | 701/207 |
| 2006/0226836 A1 | * | 10/2006 | Shu et al. | 324/309 |

* cited by examiner

*Primary Examiner*—Brij Shrivastav
*Assistant Examiner*—Tiffany A. Fetzner
(74) *Attorney, Agent, or Firm*—Quarles & Brady LLP

(57) ABSTRACT

A 3D MRI image is acquired as a series of spherical shells of increasing radius. Each shell is sampled by one or more interleaved spiral sampling trajectories and to shorten the scan time one or more spiral sampling trajectories are skipped in the larger shells that sample the periphery of k-space. Motion correction of the acquired k-space data is accomplished by reconstructing tracking images from each of the shells and locating markers therein which indicate object movement from a reference position. The k-space data is corrected using this movement information.

12 Claims, 5 Drawing Sheets

UNDER-SAMPLED 3D MRI USING A SHELLS K-SPACE SAMPLING TRAJECTORY

CROSS-REFERENCE TO RELATED APPLICATIONS

This application is based on U.S. Provisional patent application Ser. No. 60/670,588 filed on Apr. 12, 2005 and entitled "Under-Sampled, Self-Navigated 3D MRI Using Shell k-Space Sampling Trajectories."

BACKGROUND OF THE INVENTION

The field of the invention is nuclear magnetic resonance imaging (MRI) methods and systems. More particularly, the invention relates to the rapid acquisition of three-dimensional MR images.

Any nucleus that possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. One such method is disclosed in U.S. Pat. No. 5,532,595 which is incorporated herein by reference. This so-called "shell" k-space sampling trajectory samples a spiral pattern around a spherical surface. A complete image acquisition is comprised of a series of such spiral sampling patterns over a corresponding series of spheres of increasing diameter.

Object motion during the acquisition of NMR image data produces both blurring and "ghosts". Ghosts are particularly apparent when the motion is periodic, or nearly so. For most physiological motion each view of the NMR signal is acquired in a period short enough that the object may be considered stationary during the acquisition window. In such case the blurring and ghosting is due to the inconsistent appearance of the object from view to view. Motion that changes the appearance between views such as that produced by a patient moving, by the respiration or the cardiac cycle, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the subject to reduce view-to-view motion. This method is known as gated or triggered NMR scanning, and its objective is to acquire NMR data at the same point during successive functional cycles so that the subject "looks" the same in each view. The drawback of gating is that NMR data may be acquired only during a small fraction of the subject's functional cycle, and even when the shortest acceptable pulse sequence is employed, the gating technique can significantly lengthen the data acquisition.

Another method for reducing motion artifacts is to correct the acquired data to offset the effects of patient motion. As described for example in U.S. Pat. Nos. 4,937,526 and 5,539,312, this requires that so-called "navigator signals" be periodically acquired during the scan. The navigator signal data are used to retrospectively correct the acquired NMR signals for patient motion or to prospectively correct for patient motion by altering the pulse sequence. Such navigator signal acquisitions are in addition to the NMR data acquisitions, and they therefore can significantly lengthen the total scan time.

In conventional, fully-sampled MRI, the number of acquired k-space data points is determined by the spatial resolution requirements, and the Nyquist criterion for the alias-free field of view (FOV). Images can be reconstructed, however, using a reduced number of k-space samples, or "undersampling". The term undersampling here indicates the Nyquist criterion is not satisfied, at least in some regions of k-space. Undersampling is used for several reasons, including reduction of acquisition time, reduction of motion artifacts, achieving higher spatial or temporal resolution, and reducing the tradeoff between spatial resolution and temporal resolution. Aliasing artifacts that result from undersampling are not as severe if the violation of the Nyquist criterion is restricted to the outer part of k-space.

The time required to fully sample 3D Cartesian k-space is relatively long. Alternative non-Cartesian trajectories can provide faster coverage of k-space, and more efficient use of the gradients. When a very fast volume acquisition is required, undersampling strategies can be used in conjunction with these non-Cartesian trajectories to further reduce the scan time. The method of Lee J H, Hargreaves B A, Hu B S, Nishimura D G; Fast 3D Imaging Using Variable-Density Spiral Trajectories With Applications To Limb Perfusion, Magn. Reson. Med. 2003; 50(6): 1276-1285, uses a variable-density stack of spiral trajectories that varies the sampling density in both the $k_x$-$k_y$ plane and the $k_z$ direction. That method preserves reasonable image quality, while reducing the acquisition time by approximately half compared to a fully-sampled acquisition. Vastly undersampled 3D projection acquisition as described by Barger V A, Block W F, Toropov Y, Gist T M, Mistretta C A, Time-Resolved Contrast-Enhanced Imaging With Isotropic Resolution and Broad Coverage Using An Undersampled 3D Projection Trajectory, Magn. Reson. Med. 2002; 48(2):297-305, has been used to increase temporal resolution and provide better dynamic information for 3D contrast-enhanced MRA. The aliasing caused by undersampling in this method can be tolerated because the vessel-tissue contrast is high and the artifacts are distributed, or spread out in the image.

SUMMARY OF THE INVENTION

The present invention is a method for acquiring 3D MR image data using a series of shell sampling patterns. Undersampling is done in the larger shells that sample the periphery of k-space and each shell trajectory can be motion corrected using information in the acquired samples for that shell.

One aspect of the present invention is the recognition that 3D MR images can be efficiently acquired using shell k-space sampling trajectories by reducing sampling at the periphery of k-space. This can be achieved by skipping samples acquired along selected peripheral shell sampling trajectories or by skipping entirely the sampling of selected peripheral k-space shells. Preferably, however, peripheral k-space shells are acquired as a plurality of interleaved spiral shell trajectories and undersampling is accomplished by selectively reducing the number of interleaved spiral sampling trajectories in peripheral shells.

Another aspect of the present invention is the correction of MR images acquired with shell sampling trajectories for subject motion using the acquired image data itself. A tracking image can be reconstructed from image data acquired with one or more shell sampling trajectories and this tracking image is registered with a reference tracking image to determine the subject motion that has occurred. This information is employed to correct the k-space data used to produce the tracking image for subject motion. Information in the acquired shell image data itself is thus used to motion correct itself.

An objective of the motion correction aspect of the present invention is to reduce the amount of acquired image data needed to reconstruct a tracking image. This increases the temporal resolution of the correction process by enabling more frequent corrections for motion during the scan. This objective is achieved by placing point source markers in the field of view and using these markers to register each tracking image with the reference tracking image. Point sources have a characteristic "bull's-eye" pattern in tracking images reconstructed from highly undersampled data sets formed by shell sampling trajectories and these can be found and registered.

GENERAL DESCRIPTION OF THE INVENTION

Figure 7:
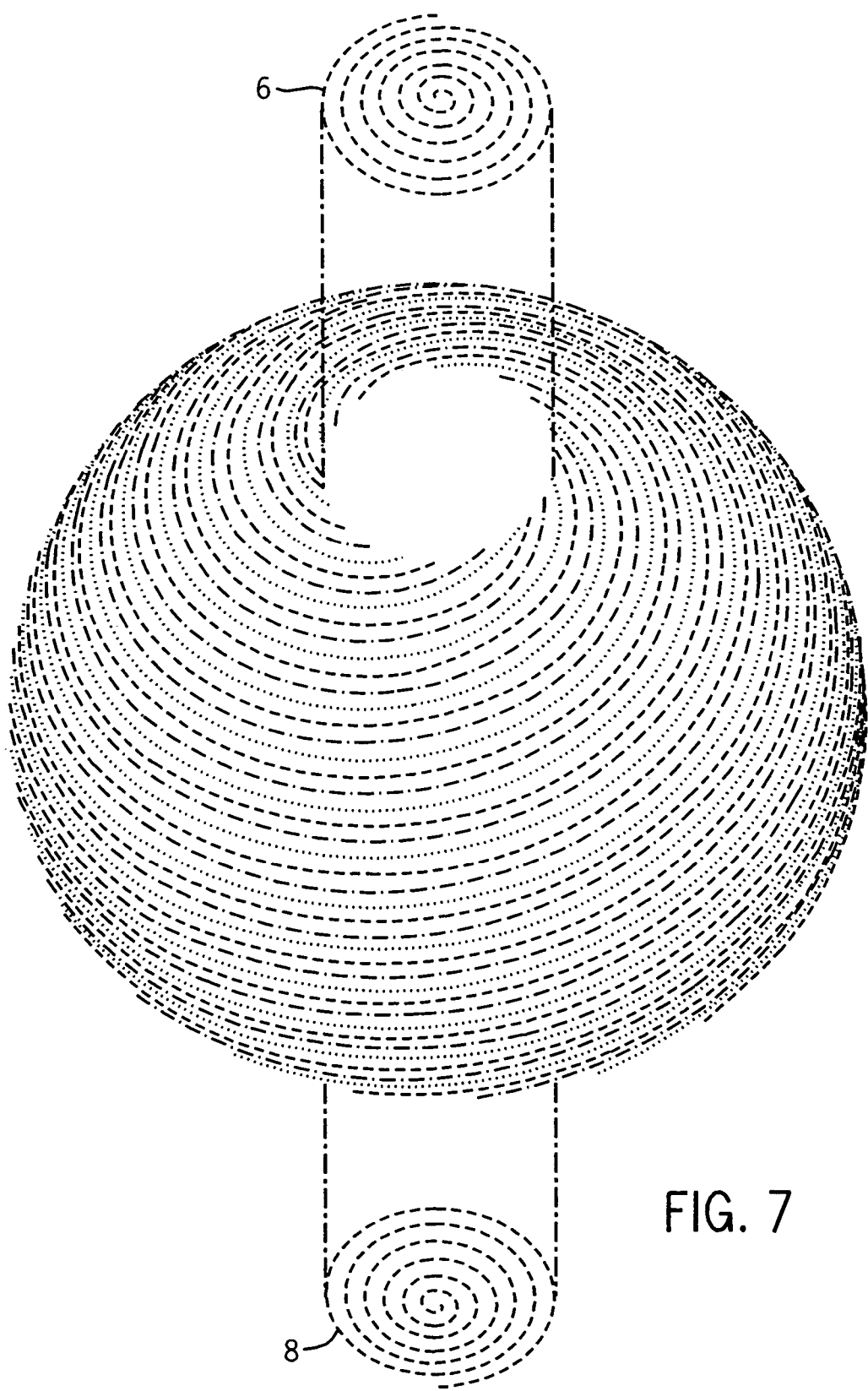
FIG. 7 is a pictorial representation of a shell k-space sampling trajectory used in the preferred embodiment.

One aspect of the present invention is to implement an undersampling acquisition strategy using a shell sampling trajectory. As indicated above, a shell k-space sampling strategy acquires one or more interleaved spiral patterns around a spherical-like surface in k-space as shown in FIG. 7. A complete 3D acquisition is comprised of a series of such spiral sampling patterns over a plurality of spheres of progressively larger radius. The entire spherical k-space is thus divided into a series of spherical shells with radii ranging from 0.5 k to $(N_s-0.5)\cdot\delta k$, where $\delta k$ is the k-space sampling unit, which is the inverse of the imaging FOV, that is assumed to be isotropic. Usually the sampling starts with the smallest shell, followed by shells of progressively increasing radii. In this manner, k-space representing the low spatial frequencies is sampled earliest in the acquisition.

Expressions can be developed as a function of the readout index p, where p=0, 1, 2, ... $N_p-1$:

$$k_z(p) = k_0 \frac{2p - (N_p - 1)}{N_p - 1} \tag{1}$$

$$k_x(p) = k_0 \sqrt{1 - \left(\frac{k_z(p)}{k_0}\right)^2} \cos\left[\sqrt{\frac{N_p \pi}{M_s}} \arcsin\left(\frac{k_z(p)}{k_0}\right) + \frac{2m_s \pi}{M_s}\right] \tag{2}$$

$$k_y(p) = k_0 \sqrt{1 - \left(\frac{k_z(p)}{k_0}\right)^2} \sin\left[\sqrt{\frac{N_p \pi}{M_s}} \arcsin\left(\frac{k_z(p)}{k_0}\right) + \frac{2m_s \pi}{M_s}\right] \tag{3}$$

where the interleaf index $m_s=1, 2, \ldots, M_s$, the shell index $S=1, 2, \ldots, N_s$, $N_s$ is the total number of shells, and $M_s$ is the total number of interleaves in a shell.

For a full sampling of k-space, the total number of interleaved spirals (i.e., shots) is determined by the Nyquist criterion and the length of the readout. We assume that the sampling points tessellate the surface of the sphere with equilateral triangles. The total number of interleaves $M_s$ for a shell of radius $k_0$ is then given by:

$$M_s = \frac{8\pi k_0^2 L^2}{\sqrt{3} N_p}, \tag{4}$$

where $k_0$ is the shell radius, L is the diameter of the imaging FOV, and $N_p$ is the number of data points per readout. Equation (4) indicates that the number of interleaves $M_s$ (i.e., the number of shots per shell) increases quadratically with the shell radius. Hence, a large portion of imaging time is spent acquiring data from the periphery of k-space. Because the highest signal is located around the k-space origin, or center, undersampling of the periphery is a useful method to reduce acquisition time.

In a practical pulse sequence implementation, the slew rate limit of the hardware is usually exceeded when the sampling trajectory approaches the two "poles" of the sphere. When the hardware limits are exceeded, the helical spirals are stopped at the "polar icecap" regions of each shell and two separate spiral sampling trajectories indicated at 6 and 8 in FIG. 7 are played out with an accompanying logical-z gradient as described by Glover G H, Simple Analytic Spiral K-space Algorithm, Magn. Reson, Med. 1999;42(2):412-415. This polar region sampling strategy is not altered when practicing the preferred embodiment of the undersampling method.

There are several possible ways to implement undersampling for the shells trajectory. One can remove sampled points along an interleaf (i.e., spiral sampling trajectory), remove entire shells, or remove selected interleaves within selected shells. If sample points are skipped in a shell interleaf the distance in k-space traversed between the unskipped neighboring points $\Delta k$ will be increased. The increase results in the change of the sampling time $\Delta t$, the inverse of the full receiver bandwidth or $G(t)$, the magnitude of the gradient vector, according to:

$$\Delta k = \frac{\gamma}{2\pi} G(t) \Delta t, \tag{4A}$$

For example, an undersampling rate of 2 can be achieved by skipping every other data point. This can be done by reducing the number of readout data points by half, doubling $\Delta t$ and halving the readout sampling bandwidth. The total acquisition time, however, is not reduced with this method. An alternative method is to keep the readout bandwidth fixed, while skipping every other data point. From Equation 4A, this method requires that the gradient amplitude and slew rate be increased to retain the same $\Delta k$. Because the shell acquisition is typically gradient slew rate limited, this method is not preferred.

Skipping entire shells also has drawbacks. In general, it has less flexibility than skipping interleaves. Also, simulations show that for comparable scan time saving, skipping entire shells produces greater undersampling artifacts than skipping interleave spiral trajectories.

Because the number of interleave spiral trajectories in each shell increases in number as the k-space radius of the shell increases there are a number of ways to undersample by skipping interleaves. As indicated by the above Equations 1-3, the number of interleaved spiral trajectories ($M_s$) in any one shell can range from 1 to 100 as the k-space radius increases.

A systematic way to determine how many interleaves to remove from a given shell is useful. One method is to decimate the number of interleaves as a function of k-space radius according to a monotonically decreasing function. A standard windowing function that is used in digital signal processing (DSP) can be used for the apodization. The second half of a fixed length Kaiser window is chosen as the monotonically decreasing function because with appropriate choice of parameters, its shape covers important special cases including the Bartlett, Hamming, Hanning, and Blackman windows. The Kaiser window is based on zero-order modified Bessel function of the first kind $I_0$. It is widely used in DSP applications like finite impulse response (FIR) filter design. Its equation can be expressed as:

$$w(n) = \frac{I_0\left[\beta\sqrt{1-\left(1-\frac{2n}{M}\right)^2}\right]}{I_0(\beta)}, \tag{5}$$

for $0 \leq n \leq M$. The length of the window is chosen to be twice the number of shells, i.e., $M = 2 \times N_s$. We use the second half of the Kaiser window for the undersampling design, so that only the part $N_s + 1 \leq n \leq M$ is used. The parameter $\beta$ determines the shape of the window and the degree of tapering. Some important special cases include a rectangular window ($\beta = 1$), a Hanning window ($\beta = 3.86$) and a Hamming window ($\beta = 4.86$). Six sampling schemes based on the Kaiser window with a variety of values for $\beta$ have been examined.

Figure 2:
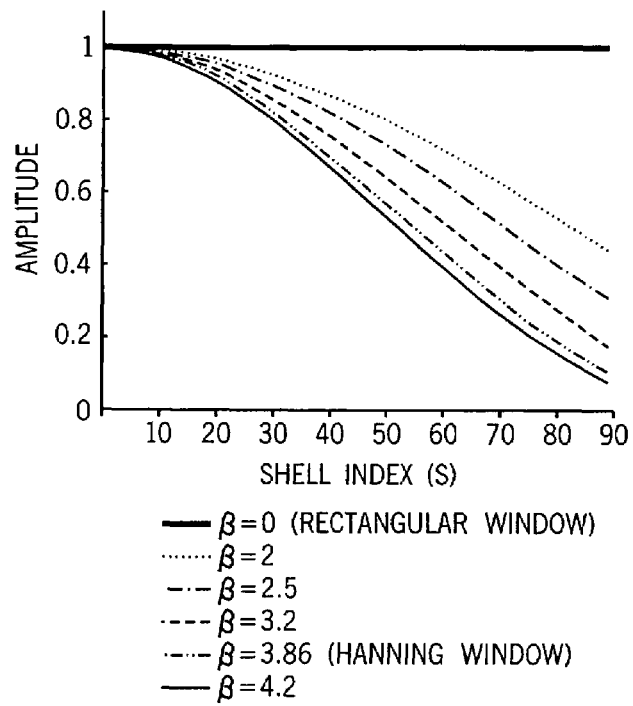
FIG. 2 is a graphic representation of the second half of a Kaiser window.

A fully sampled shell trajectory that satisfies the Nyquist criterion was used as a starting point. The undersampling rate was unity for all the shells, which corresponds to a rectangular window, or the Kaiser window when $\beta = 1$. Then five undersampled trajectories were generated based on the Kaiser window with $\beta = 2, 2.5, 3.2$ or $4.2$. If the window represents the k-space sampling density, then these values of $\beta$ result in a decrease in the total number of shots ranging from 30% to 60% of the total as shown in Table 1. The corresponding (second halves) of the Kaiser windows are plotted in FIG. 2.

TABLE 1

| $\beta$ | 1 | 2 | 2.5 | 3.2 | 3.86 | 4.2 |
|---|---|---|---|---|---|---|
| No. of Shots | 3595 | 2480 | 2157 | 1808 | 1549 | 1456 |
| Relative acquisition time | 1 | 0.7 | 0.6 | 0.5 | 0.43 | 0.4 |
| SNR | 102.9 | 79.23 | 73.78 | 60.71 | 57.56 | 31.21 |
| Normalized SNR | 102.9 | 94.7 | 95.25 | 85.86 | 87.78 | 49.36 |
| Relative PSF central peak | 1.000 | 0.999 | 0.978 | 0.975 | 0.951 | 0.939 |
| Relative PSF FWHM | 1.000 | 1.003 | 1.010 | 1.012 | 1.023 | 1.024 |

*Note the normalized SNR is defined as $SNR_{normalized} = SNR/\sqrt{time}$

If interleaves are skipped according to the window function w, then the reduced number of interleaves $M_x^{US}$ for shell S can be calculated from:

$$M_s^{US} = \text{round}[M_s \times w(S+N+1)] \tag{6}$$

An effort is made to cover the shells uniformly, so the actual number of interleaves is chosen to be the product of a fraction r (i.e., r=½, ¾, etc.) of the original number of interleaves $M_s$ in the shell. For example, if $r=\frac{1}{2}$, every other interleaf is removed whenever $M_s^{US}$ is approximately $M_s/2$. Similarly, when $M_s^{US}/M_s$ is between 0.23 and 0.3, the fraction $r=\frac{2}{7}$ is used. In this case, the interleaves on that shell are divided into groups of seven. Within each group, only the first and fourth interleaves are retained. Table 1 lists the total number of interleaves for each value of $\beta$, which represents an individual sampling scheme. The acquisition time relative to the fully sampled scheme ($\beta=1$) is also listed.

Another aspect of the present invention is the "self-navigating" motion correction properties of k-space data acquired as a series of shells. By self-navigating we mean that information contained in each acquired shell enables it to be motion corrected without the need for acquiring separate navigator signal data. Thus, motion correction is achieved without increasing scan time.

Figure 3:
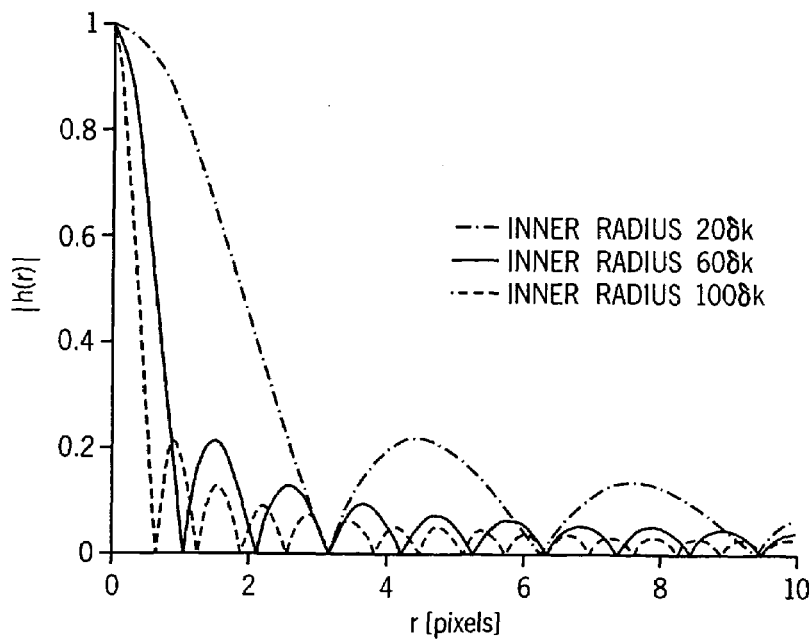
FIG. 3 is a graphic representation of radial profiles of representative point spread functions.

To track rigid body motion, a set of 3D tracking images are produced during the scan. Each tracking image is reconstructed from data sampled on a spherical shell in k-space. This incomplete k-space data set introduces many image artifacts. One of these artifacts is due to a non-ideal point spread function (PSF) in the image reconstruction process. The analytical expression for the PSF is calculated by taking the 3D Fourier transform of a uniform spherical shell k-space signal. The resulting PSF is itself spherically symmetric, and produces a symmetrical pattern that is centered around the true location of the point source in an object being imaged. The radial profiles for representative examples of several 3D PSF's are plotted in FIG. 3 for acquired shells of various inner radii, and a thickness equal to δk.

Small, spherical markers are used to track arbitrary rigid body motion in the subject while acquiring the k-space data set as a series of spiral shell sampling trajectories. If the diameter of the spherical marker is much smaller than the imaging voxel size, then it approximates a point source, and its k-space signal will be distributed evenly throughout k-space. In that case, the marker is "persistent" in that its signal can be detected in an image reconstructed from a shell of acquired k-space data. Also, in that case the image response of the very small marker is well approximated by the PSF. Smaller markers, however contain less magnetization, and consequently produce a signal having a lower signal-to-noise ratio. This trade-off is partially overcome by encasing the marker in a small, inductively coupled coil. Even using an inductively coupled coil to boost its signal, the diameter of the MR active region of the marker will usually be on the order of, or slightly larger than a voxel. Generally, it is convenient to choose a spherical shape for the MR-active region of the marker. The image response of such a sphere is like the PSF, and like the PSF, the resulting symmetric pattern in the reconstructed tracking image is spherically symmetric and is centered about the true location of the spherical marker. Increasing the marker signal allows one to track motion using thinner shells of k-space data, which can increase the temporal resolution of the tracking method.

Rigid body motion during the scan is tracked by fixing three point-markers to the subject of the scan in a non-collinear arrangement. A set of tracking images are reconstructed from shells of k-space data that correspond to specific time intervals during the scan. The reference coordinates of the markers are obtained by reconstructing a 3D reference tracking image from a small sphere of k-space obtained during the first time interval (e.g., 1 second) of the acquisition when the center of k-space is being acquired. The three-dimensional coordinates for each of the markers are measured by locating the centroid of each symmetrical pattern in the reconstructed tracking image. The task then is to correct each shell of k-space data acquired during subsequent time intervals so that the locations of the markers in the tracking image for that interval corresponds to the reference marker locations. Correction for subject translation is performed by applying a linear phase shift to the k-space data, and correction for subject rotation is performed by applying the same rotation in k-space. For example, to shift the image by an amount Δx along the x axis, the acquired k-space data is multiplied by a factor $\exp(2\pi i k_x \Delta x)$.

General rigid body rotation and (or) translation in each time interval can be corrected by a Euclidean transformation:

$$\begin{bmatrix} x' \\ y' \\ z' \\ 1 \end{bmatrix} = T(\Delta x_2, \Delta y_2, \Delta z_2) \cdot R(\theta_x, \theta_y, \theta_z) \cdot T(\Delta x_1, \Delta y_1, \Delta z_1) \begin{bmatrix} x \\ y \\ z \\ 1 \end{bmatrix}, \quad (7)$$

where the translation matrix is $$T(\Delta x_i, \Delta y_i, \Delta z_i) = \begin{bmatrix} 1 & 0 & 0 & \Delta x_i \\ 0 & 1 & 0 & \Delta y_i \\ 0 & 0 & 1 & \Delta z_i \\ 0 & 0 & 0 & 1 \end{bmatrix}, \quad (7A)$$

and, for example $\Delta x_1$ is the first translation along the x-axis. A rotation about an arbitrary axis can be expressed by the combination of a translation of the rotation axis to the origin, a rotation about an axis through the origin, and a translation of the rotation axis back to its original location, i.e., $\Delta x_1 = -\Delta x_2$, $\Delta y_1 = -\Delta y_2$ and $\Delta z_1 = -\Delta z_2$.

The rotation in equation (7A) is given by the orthogonal matrix $$R(\theta_x, \theta_y, \theta_z) = \begin{bmatrix} C_y C_z & S_x S_y C_z - C_x S_z & C_x S_y C_z + S_x S_z & 0 \\ C_y C_z & S_x S_y S_z + C_x C_z & C_x S_y S_z - S_x C_z & 0 \\ -S_y & S_x C_y & C_x C_y & 0 \\ 0 & 0 & 0 & 1 \end{bmatrix} \quad (8)$$

where $C_i = \cos \theta_i$, $S_i = \sin \theta_i$, and $\theta_i$ represents a rotation about axis i=x, y or z. Naturally other descriptions of the rotation (such as Euler angles) can be used.

There are several ways that the translation and rotation parameters for the motion correction can be extracted, but in the preferred embodiment the first translation $T(\Delta x_1, \Delta y_1, \Delta z_1)$ in equation (7) is selected so that it aligns the centroid of the triangle formed by the three markers in a tracking image back to the origin. The second translation in equation (7) is the inverse of the translation that is required to align the centroid of the three markers in the reference image to the origin. (Consequently, the same $T(\Delta x_2, \Delta y_2, \Delta z_2)$ is re-used for each shell). The accuracy of the measured location of the markers can be degraded by several systematic errors such as off-resonance blurring, gradient non-linearity, eddy currents and concomitant fields. Therefore, a fitting procedure (rather than an analytical solution) is used to identify the optimal rotation. To search for the optimal values of the rotation angles $\theta_x$, $\theta_y$, $\theta_z$ in equation (7), a cost function is set equal to the sum of square of the distances between the corresponding markers in the tracking and reference images, using their measured coordinates. A down-hill simplex algorithm as described by Press W H, Teukolsky S A, Vetterling W T, Flannery, "Numerical Recipes In C", New York, N.Y.: Cambridge University Press; 1992, is used to minimize the sum of the squares of the three distances. All three rotation angles typically can be obtained after 300-400 iterations.

A 3D MRI scan may thus be conducted using a shell sampling trajectory that enables controlled undersampling of peripheral k-space to reduce the scan time or increase image resolution, and which enables the correction of the acquired k-space data for subject motion using information in the acquired k-space data itself.

DETAILED DESCRIPTION OF THE PREFERRED EMBODIMENT

Figure 1:
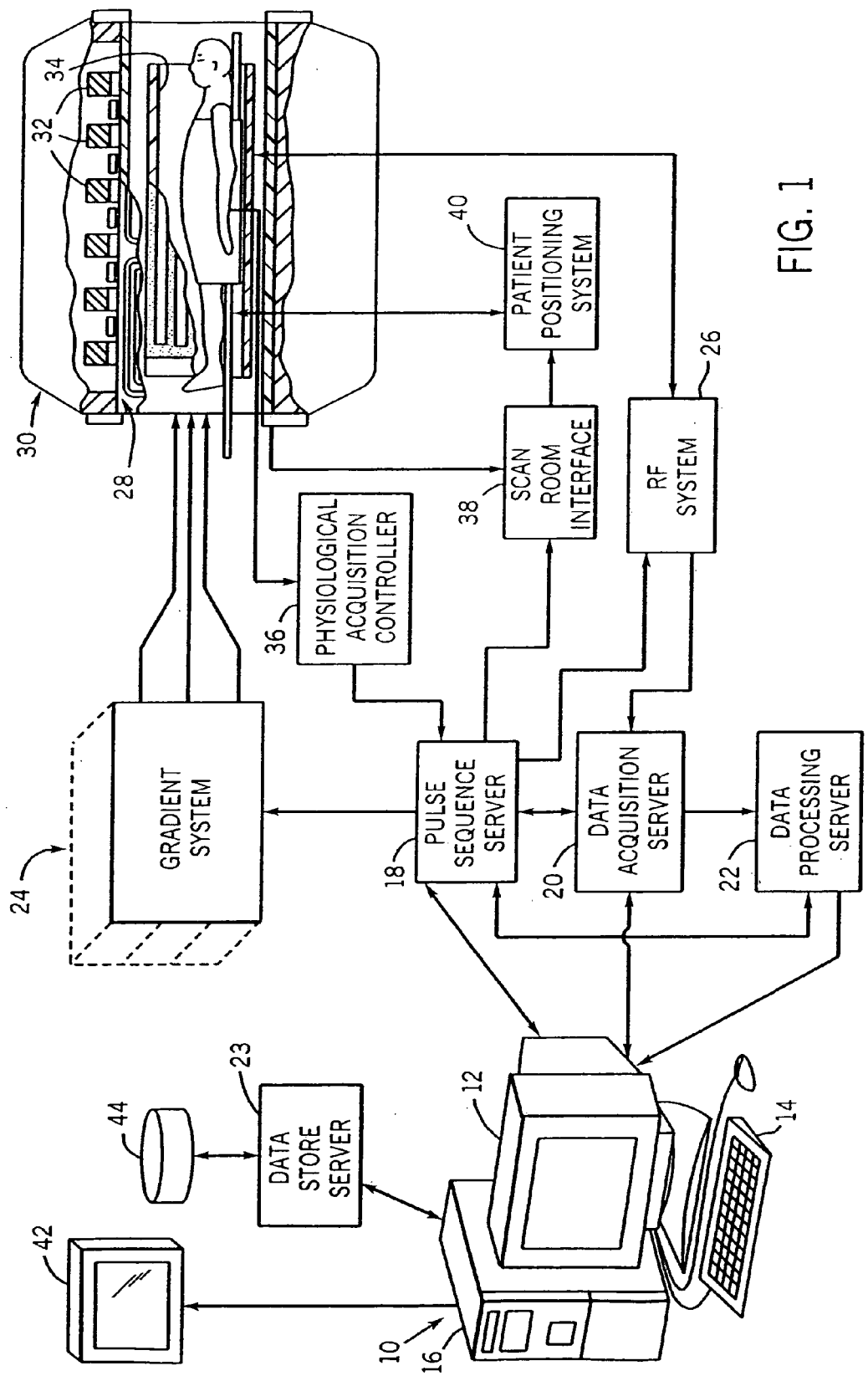
FIG. 1 is a block diagram of an MRI system which is employed to practice the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34. The gradients are capable of 33 mT/m amplitude and a slew rate of 120 T/m/s.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

It is this phase $\phi$ that is changed in the acquired k-space data to make the motion corrections described below.

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 4:
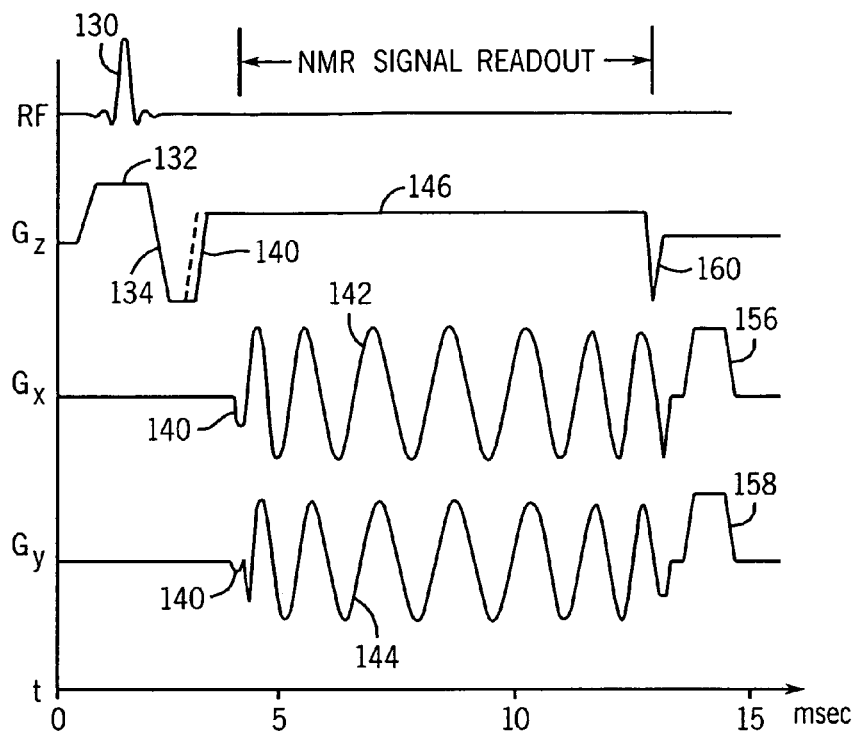
FIG. 4 is a graphic representation of a preferred pulse sequence employed by the MRI system of FIG. 1 to practice the preferred embodiment.
Figure 5:
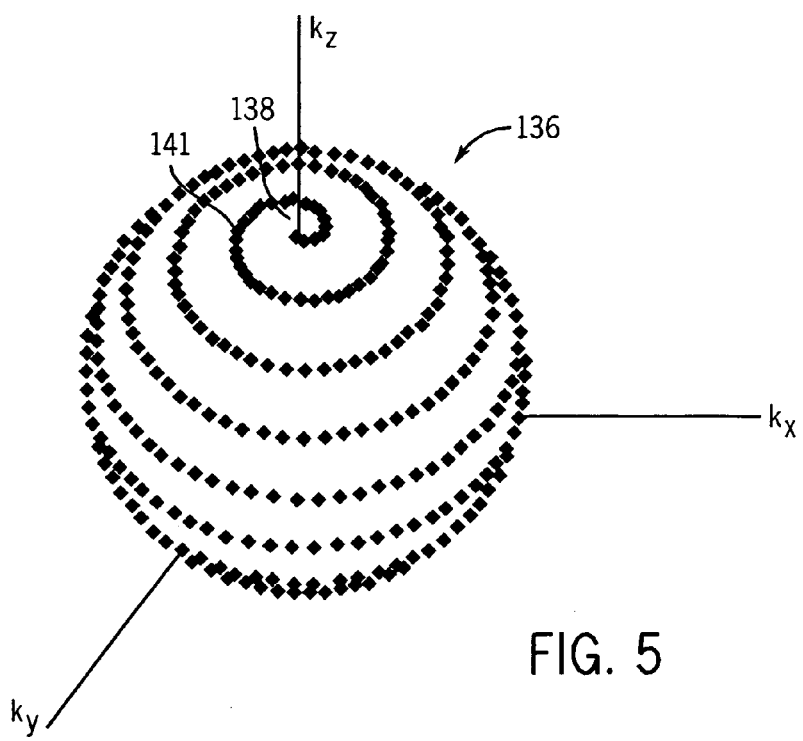
FIG. 5 is a pictorial representation of a shell sampling trajectory acquired with the pulse sequence of FIG. 4

Referring particularly to FIGS. 4 and 5, the shell pulse sequence includes a volume selective RF excitation pulse 130 which is produced in the presence of a $G_z$ slab select gradient pulse 132 to produce transverse magnetization throughout the region being imaged. This is followed by a $G_z$ rephasing pulse 134 which has one-half of the area of $G_z$ slab select gradient pulse 132. The three gradient fields $G_x$, $G_y$, and $G_z$ are then manipulated during signal readout to sample three-dimensional k-space on the surface of a sphere 136 centered at the origin of k-space and having a radius $K_p$.

The spherical surface 136 is sampled by a helical spiral trajectory which starts at a point 138 where $k_z$=k, spirals down to the opposite side, or pole, of the sphere where $k_z$=-k. The starting point is established by prephasing gradient pulses 140, and the downward spiral sampling trajectory 141 is produced by sinusoidal $G_x$ and readout gradients 142 and 144 in the presence of a small amplitude, $G_z$ gradient 146. The $G_x$ and readout gradients 142 and 144 vary sinusoidally to produce the helical spiral sampling pattern 141. The helical spiral sampling pattern 141 is designed such that the surface of the sphere 136 is sampled substantially uniformly throughout. The readout is followed by rewinder gradients 160, 156 and 158 to bring the sampling trajectory back to the k-space origin.

The acquisition parameters are TR=15 ms, readout length 8.192 ms with 1024 complex samples per readout, a total of $N_s$=90 shells, an isotropic (i.e., spherical) field of view of 256 mm, with isotropic spatial resolution of 1.4 mm, a sampling bandwidth=±62.5 kHz (i.e., 694 Hz/pixel), RF spoiling, and a flip angle=20°. The total number of interleaves is $$\sum_{s=1}^{90} M_s = 3595,$$

yielding an acquisition time of 55 seconds, which includes 1 second for dummy acquisitions at the start of the scan. The first three shells use a single interleave because $M_s$<1 in equation (4). If lipid suppression is desired, then an 8 ms CHESS pulse is applied for each repetition, the TR is increased to 26 ms, and the total scan time increases to 95 seconds. The logical z-gradient axis is aligned along a direction that enables the RF pulse 130 to select a slab that excludes signals from other parts of the subject that might be aliased into the FOV.

The gradient waveforms for a pole-to-pole shell trajectory are derived from the k-space trajectory by the following equations:

$$G_x(t) = \frac{2\pi}{\gamma} \frac{dk_x}{dt} \quad (9)$$

$$G_y(t) = \frac{2\pi}{\gamma} \frac{dk_y}{dt} \quad (10)$$

$$G_z(t) = \frac{2\pi}{\gamma} \frac{dk_z}{dt} \quad (11)$$

As indicated above, at larger k-space radiuses a plurality ($M_s$) of interleaved shell trajectories are acquired by repeating the above pulse sequence. This is achieved by repeating the above pulse sequence but changing the angle at which the trajectory leaves the starting point as indicated above in equations (2) and (3). Also, in the preferred embodiment sampling starts and stops a short distance from each pole when the gradient slew rate limits are reached.

To correct the acquired k-space data for subject motion, three point-like sources of strong NMR signal are positioned on the subject. These "markers" are three glass tubes with inside diameter 2.5 mm and length 15 mm that are filled with copper sulfate solution (1 gram $CuSo_4$ per liter of distilled $H_2O$). The tubes are partially filled with vacuum grease to make the MR-active volume of the solution roughly spherical in shape, and then sealed with silicone rubber to minimize evaporation. The marker is then encased in an inductively-coupled coil with a LC-resonant circuit tuned to the Larmor frequency to further boost the signal level. The circuit consists of a solenoidal copper inductor and matching capacitance. The wire is wound with approximately six turns around the glass tube, and a capacitance of approximately 50 pF is attached to one end of the tube to tune to 63.8 MHz. For example, the markers can be affixed conveniently to the subject by embedding them in a set of headphones used by the patient during the scan.

Figure 6:
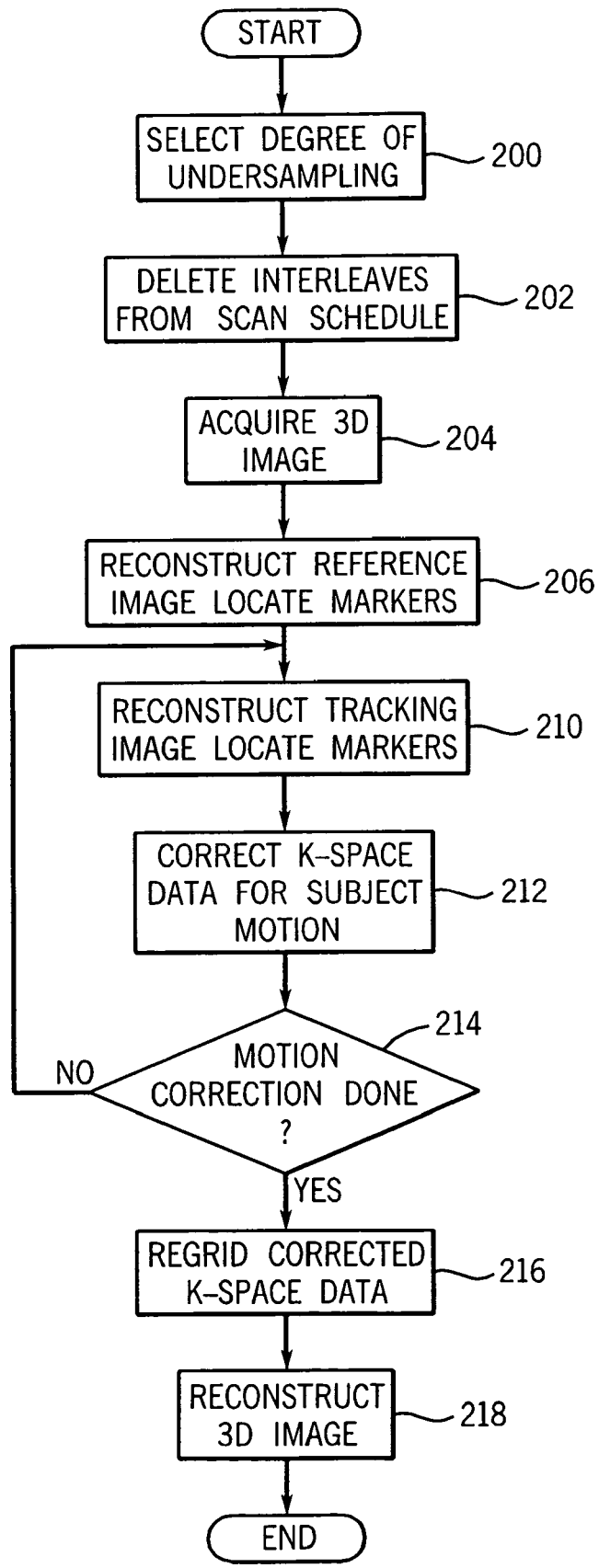
FIG. 6 is a flow chart of the steps performed when practicing a preferred embodiment of the invention.

Referring particularly to FIG. 6, a scan is started by selecting the degree of undersampling that is to be done as indicated at process block 200. This can be done using one of the parameters in Table 1 such as β or relative acquisition time. As indicated at process block 202 and explained above, based on the degree of undersampling selected, interleaved shell trajectories are deleted from the scan schedule. Most of these are in the outer most shells which sample the periphery of k-space as explained above.

The modified scan schedule is then used to direct the MRI system to acquire a 3D image data set using the pulse sequence of FIG. 4 as indicated at process block 204. The prescribed shell trajectories are acquired in sequence starting with the shell near the center of k-space having the smallest radius and working outward to the largest radius shell that defines the outer boundary of the sampled k-space spherical volume. This "centric" acquisition order is advantageous in a number of clinical application such as contrast enhanced MRA.

The acquired k-space data set is passed to the data processing server 22 and the image reconstruction process begins. First, as indicated at process block 206 a reference tracking image is reconstructed using one or more shells acquired at the beginning of the scan near the center of k-space. The available k-space samples are regridded onto a 3D Cartesian coordinate system and unsampled k-space locations on the grid are zero-filled. A Three-dimensional Fourier transformation is then performed to reconstruct a three-dimensional reference tracking image data set. The center of the spherically concentric patterns in the tracking image around each of the three point source markers are located by finding the pixels with maximum signal intensity. It can be appreciated that because the k-space data set used to produce this reference tracking image is very incomplete, the resulting image of the subject is very blurry and riddled with image artifacts. Nevertheless, because of the shape of the shell sampling trajectory, the point source-like markers produce distinct patterns which can be found in the image. These patterns are distinct enough that their centers can be determined and the marker positions precisely located.

Referring still to FIG. 6, a loop is then entered in which the acquired k-space data is corrected for subject motion during the scan. As indicated at process block 210 a tracking image is reconstructed from one or more shells of acquired k-space data that is to be motion corrected. The reconstruction method is the same as that described above for the reference tracking image. There is a trade-off to be made in the number of shells (and hence interleaved trajectories) to be included in each tracking image. More k-space data results in a higher SNR tracking image, but it also lengthens the time interval over which the k-space data was acquired. More k-space data per tracking image thus reduces the temporal resolution of the motion correction process. The temporal resolution that is required will depend on the nature of the subject motion and hence each particular clinical application. As with the reference tracking image, the marker locations are found in the reconstructed tracking image. However, rather than searching the entire volume, a small volume of interest (e.g. 5 cm 5 cm 5 cm) is selected for each marker based on the location of the marker determined previously in the reference tracking image. The marker locations are located in each of these small volumes at the maximum intensity pixel.

As indicated at process block 212, the k-space data used to produce the tracking image is then corrected for subject motion. This is accomplished using the transformations discussed above with respect to equations (7) and (8) to determine the rotations and translations needed to align the markers with the markers in the reference tracking image. Knowing these, the k-space rotations of the acquired k-space data and the phase shifts of the k-space data are made as discussed above to motion correct the acquired shell.

This correction of acquired groups of interleaves continues until all of the acquired k-space data has been motion corrected as determined at decision block 214. The motion corrected k-space data set is now in condition to reconstruct a 3D image.

A standard 3D image reconstruction may be used. As indicated at process block 216, in the preferred embodiment the acquired k-space data is regridded onto a 3D Cartesian coordinate system using a method described by Jackson J I, Meyer C H, Nishimura D G, Macovski A, Selection Of A Convolution Function For Fourier Inversion Using Gridding [Computerised Tomography Application], Medical Imaging, IEEE Transactions on 1991; 10(3):473-478. However, three-dimensional Voronori cells described by Rasche V, Proksa R, Sinkus R, Bornert P, Eggers H, Resampling Of Data Between Arbitrary Grids Using Convolution Interpolation, Medical Imaging, IEEE Transactions on 1999; 18(5):385-392, were used to calculate the density compensation factors. Due to the relatively complicated geometry of the shell trajectory, we were not able to derive a closed-form analytical expression for the density compensation function. Instead, the volume of each Voronoi cell was calculated numerically using MatLab 7 (The MathWorks, Natwick, Mass.) using the k-space points that are sampled along the trajectory given by equations (1)-(3) along with the additional interleaves that cover the "polar ice caps". The volume of the Voronoi cell associated with each sampling location is used for the density compensation estimate. The evaluation of the density compensation factors requires approximately one hour of CPU time, but it is only calculated once for this shell trajectory, and then stored for repeated use. A standard Kaiser-Bessel convolution kernel covering four times the grid space is used. To reduce aliasing artifacts, the grid dimension is chosen to be the next highest power of two (i.e., 256) compared to the number of samples, which is equal to twice the number of shells $2 \times N_s = 180$. A complex three-dimensional inverse Fourier transformation is then performed on the regridded data as indicated at process block 218.

A 3D pulse sequence based on the spherical shells k-space sampling trajectory has been described and implemented. When used in conjunction with three point-markers, the shell trajectory allows for correction of arbitrary rigid body motion correction with retrospective processing. Arbitrary rigid body motion can be corrected throughout the acquisition, with temporal resolution of approximately 1 second.

The shells sampling trajectory is a 3D non-Cartesian trajectory that can offer improved data acquisition efficiency compared to the Cartesian trajectory. Undersampling can be used in conjunction with the spherical shells k-space trajectory to further accelerate the acquisition for time-constrained applications. The undersampled shells technique has several clinical applications. In phase contrast angiography, the phase difference subtraction removes many undersampling artifacts, so that higher values of β can be selected. Also, applications were the target anatomy has high contrast, such as gadolinium-enhanced MR angiography, offers good immunity to undersampled artifacts. The shells trajectory is of particular interest for MR angiography because its center-out sampling pattern is a generalization of the 3D elliptical centric view order that provides excellent venous suppression.

The invention claimed is:

1. In a method for sampling k-space during a scan with a magnetic resonance imaging (MRI) system that samples k-space as a series of substantially spherical shells of different radius, the improvement comprising:
   a) sampling each shell with a helical spiral sampling trajectory;

b) sampling shells of larger radius with additional helical spiral sampling trajectories that are interleaved with other helical spiral sampling trajectories in the same shell; and c) undersampling the periphery of k-space by skipping the acquisition of k-space samples in helical spiral sampling trajectories in shells of larger radius.

2. The method as recited in claim 1 in which entire helical spiral sampling trajectories are selectively skipped.

3. The method as recited in claim 1 in which the amount of undersampling as a function of shell radius is determined by a monotonically decreasing function.

4. The method as recited in claim 3 in which the monotonically decreasing function is a Kaiser window.

5. The method as recited in claim 1 in which step c) includes selecting the amount of undersampling.

6. The method as recited in claim 1 in which shells are acquired in step a) in a centric order in which the k-space radius of the acquired shells progressively increases with time.

7. A method for producing an MRI image of an object with a magnetic resonance imaging (MRI) system, the steps comprising:

a) acquiring k-space data by performing a series of pulse sequences with the MRI system that sample a series of shell trajectories;

b) reconstructing a reference tracking image from the acquired k-space data sampled during one or more of the shell trajectories;

c) reconstructing a tracking image from other acquired k-space data sampled during another one or more of the same series of shell trajectories;

d) detecting the movement of the object by comparing the tracking image with the reference tracking image;

e) correcting the k-space data used in step c) for the movement detected in step d)

f) repeating steps c), d) and e) until all of the acquired k-space data are corrected for object movement; and g) reconstructing an MRI image with the corrected k-space data.

8. The method as recited in claim 7 in which each shell is substantially spherical in shape, is concentric about the origin of k-space, and has a different radius than the other shells.

9. The method as recited in claim 7 in which each shell is sampled by one or more interleaved spiral sampling trajectories.

10. The method as recited in claim 7 in which three markers are positioned to move with the object and step d) is performed by detecting the location of the markers in the reference tracking image and the tracking image and calculating the change in location of said markers.

11. The method as recited in claim 10 in which the markers are each substantially a point NMR signal source that produces a distinctive pattern in the reconstructed tracking images.

12. The method as recited in claim 11 in which the distinctive pattern is spherically concentric.

* * * * *